(12) United States Patent
LaVine et al.

(10) Patent No.: US 10,311,963 B2
(45) Date of Patent: Jun. 4, 2019

(54) DATA PROCESSING

(71) Applicant: ARM LIMITED, Cambridge (GB)

(72) Inventors: Mark Gerald LaVine, Austin, TX (US); Alan Jeremy Becker, Bushey (GB)

(73) Assignee: ARM Limited, Cambridge (GB)

( * ) Notice: Subject to any disclaimer, the term of this patent is extended or adjusted under 35 U.S.C. 154(b) by 80 days.

(21) Appl. No.: 15/491,239

(22) Filed: Apr. 19, 2017

(65) Prior Publication Data

US 2018/0308560 A1  Oct. 25, 2018

(51) Int. Cl.
| | | |
|---|---|---|
| G11C 29/00 | (2006.01) | |
| G11C 29/12 | (2006.01) | |
| G06F 3/06 | (2006.01) | |
| G11C 29/38 | (2006.01) | |
| G11C 29/44 | (2006.01) | |
| G11C 7/10 | (2006.01) | |
| G11C 8/06 | (2006.01) | |
| G11C 8/10 | (2006.01) | |
| G11C 7/22 | (2006.01) | |
| G11C 29/04 | (2006.01) | |

(52) U.S. Cl.
CPC ............ G11C 29/12 (2013.01); G06F 3/0604 (2013.01); G06F 3/0631 (2013.01); G06F 3/0659 (2013.01); G06F 3/0683 (2013.01); G11C 7/1078 (2013.01); G11C 8/06 (2013.01); G11C 8/10 (2013.01); G11C 29/38 (2013.01); G11C 29/44 (2013.01); *G11C 7/22* (2013.01); *G11C 2029/0409* (2013.01); *G11C 2029/0411* (2013.01); *G11C 2029/1208* (2013.01)

(58) Field of Classification Search
None
See application file for complete search history.

(56) References Cited

U.S. PATENT DOCUMENTS

| 7,293,199 | B1 * | 11/2007 | Zarrineh | G11C 29/16 |
| | | | | 714/30 |
| 7,304,875 | B1 * | 12/2007 | Lien | G06F 11/1064 |
| | | | | 365/200 |
| 2007/0136626 | A1 * | 6/2007 | Chung | G11C 29/44 |
| | | | | 714/718 |

(Continued)

OTHER PUBLICATIONS

Combined Search and Examination Report dated Oct. 26, 2018 in GB Application 1805437.9, 5 pages.

Primary Examiner — Daniel F. McMahon
(74) Attorney, Agent, or Firm — Nixon & Vanderhye P.C.

(57) ABSTRACT

A data processing apparatus comprises at least one memory configured to store data; processing circuitry to access data in the at least one memory. Memory built-in self-test (MBIST) circuitry has an interface to access the at least one memory and is configured to perform a test procedure for testing at least one target memory location of the at least one memory. The test procedure involves at least writing test data to the target memory location. Diagnostic circuitry executes a diagnostic procedure to generate diagnostic data in response to processing operations carried out by the processing circuitry. The MBIST circuitry is configured to control writing of the diagnostic data generated by the diagnostic circuitry to memory locations in a temporarily reserved memory region comprising at least a portion of the at least one memory.

15 Claims, 8 Drawing Sheets

(56) References Cited

U.S. PATENT DOCUMENTS

2010/0157703 A1* 6/2010 Fischer ................ G11C 29/027
                                                  365/200
2012/0072791 A1   3/2012 Kim et al.
2012/0173837 A1* 7/2012 Schneider ........... G06F 12/0802
                                                  711/170
2015/0371718 A1* 12/2015 Becker .................. G11C 29/14
                                                  714/718
2017/0229191 A1* 8/2017 Ouellette ............... G11C 29/44

* cited by examiner

DATA PROCESSING

BACKGROUND

This disclosure relates to data processing.

It is known to provide a data processing apparatus with one or more instances of processing circuitry and one or more memories of a variety of different forms for storing data values to be manipulated and program instructions for specifying data processing operations to be performed. The forms of memory may include, for example, main memories, cache memories, translation lookaside buffers for storing data specifying virtual-to-physical memory address translations and/or memory permission data, and memories storing data for other uses within the data processing system, such as branch history data used for branch prediction.

It is also known to provide memory built-in self-test circuitry within data processing systems for performing memory test operations upon memories within data processing systems. Such memory built-in self-test circuitry may be used to perform initial testing upon initial manufacture of a data processing system and/or ongoing testing in the field during the life of the data processing system. Identifying a fault in the operation of a memory can be used to trigger an appropriate response, such as taking the relevant portion of the memory out of use such that it is not able to corrupt or slow the operation of the system as a whole. Many other different forms of response to a detected error are also possible.

It is also known to disable a memory or a part of the memory, in such a way that a processor accessing the memory can continue to operate without it, or without the use of all of it.

It is also known to provide in-built diagnostic circuitry to execute a diagnostic procedure to generate diagnostic data in response to processing by the processing circuitry. The diagnostic data is stored in a further memory dedicated for use by the diagnostic circuitry.

SUMMARY

In an example arrangement there is provided data processing apparatus comprising:

at least one memory configured to store data;

processing circuitry to access data in the at least one memory;

memory built-in self-test (MBIST) circuitry having an interface to access the at least one memory and being configured to perform a test procedure for testing at least one target memory location of the at least one memory, the test procedure comprising at least writing test data to the target memory location; and diagnostic circuitry to execute a diagnostic procedure to generate diagnostic data in response to processing operations carried out by the processing circuitry;

in which the MBIST circuitry is configured to control writing of the diagnostic data generated by the diagnostic circuitry to memory locations in a temporarily reserved memory region comprising at least a portion of the at least one memory.

In another example arrangement there is provided data processing apparatus comprising:

at least one memory means for storing data;

processing means to access data in the at least one memory means;

memory built-in self-test (MBIST) means having an interface means for accessing the at least one memory and being configured to perform a test procedure for testing at least one target memory location of the at least one memory, the test procedure comprising at least writing test data to the target memory location; and diagnostic means for executing a diagnostic procedure to generate diagnostic data in response to processing operations carried out by the processing means;

in which the MBIST means is configured to control writing of the diagnostic data generated by the diagnostic means to memory locations in a temporarily reserved memory region comprising at least a portion of the at least one memory means.

In another example arrangement there is provided data processing method comprising:

providing memory built-in self-test (MBIST) circuitry having an interface to at least one memory to execute a test procedure for testing at least one target memory location of the at least one memory, the MBIST test procedure comprising at least writing test data to the target memory location;

temporarily reserving a memory region comprising at least a portion of the at least one memory;

executing a diagnostic procedure to generate diagnostic data in response to processing operations; and the MBIST circuitry controlling writing of the diagnostic data generated by the diagnostic means to memory locations in the reserved memory region.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Before discussing the embodiments with reference to the accompanying figures, the following description of embodiments is provided.

An example embodiment provides a data processing apparatus comprising:

at least one memory configured to store data;

processing circuitry to access data in the at least one memory;

memory built-in self-test (MBIST) circuitry having an interface to access the at least one memory and being configured to perform a test procedure for testing at least one target memory location of the at least one memory, the test procedure comprising at least writing test data to the target memory location; and diagnostic circuitry to execute a diagnostic procedure to generate diagnostic data in response to processing operations carried out by the processing circuitry;

in which the MBIST circuitry is configured to control writing of the diagnostic data generated by the diagnostic circuitry to memory locations in a temporarily reserved memory region comprising at least a portion of the at least one memory (for example, a memory or memory portion that is normally used by the data processing circuitry).

Example embodiments allow the use of diagnostic circuitry to test the operation of processing circuitry as it processes data, but without the need for a dedicated memory to store the resulting diagnostic data. Instead, an MBIST circuitry can be used to write the diagnostic data to a temporarily reserved memory region. In examples, the MBIST circuitry can use its data interface to the memory which is otherwise used for the MBIST test procedure to store the diagnostic data in a temporarily reserved memory region which, after the diagnostic process has been completed (for example, though not exclusively, after the stored data has been read out for example by an external debugger), can be returned to non-diagnostic (normal) use. These arrangements can avoid the need for dedicated diagnostic data memories and can also potentially allow greater quantities of diagnostic data to be stored.

In examples, the MBIST circuitry is configured to execute a memory read procedure to retrieve data stored in the reserved memory region and to provide the retrieved data to an external interface. This allows the MBIST circuitry to read (as well as store) the diagnostic data.

To alleviate any effect on the remainder of the processing activity of the apparatus, in examples the at least one memory is configured to continue allowing access by the processing circuitry to memory locations other than memory locations in the reserved memory region.

The apparatus may comprise control circuitry to reserve a memory region comprising at least a portion of the at least one memory, to store the diagnostic data generated by the diagnostic circuitry executing the diagnostic procedure. For example, this could be provided by an external debugger, or by debug software running on a CPU that is part of the apparatus.

In examples, the use of the memory region by the MBIST circuitry to store diagnostic data is merely temporary, so that the control circuitry is configured to release the reserved memory region following completion of the memory read procedure in respect of the reserved memory region.

These techniques are applicable to various types of memory, but in examples the at least one memory comprises a cache memory; and the apparatus comprises a cache controller to control the storage of data to, and the retrieval of data from, the cache memory. In examples, the cache controller is configured to allocate portions of the cache memory for temporary storage of data corresponding to addresses in a higher level memory; and the control circuitry is configured to reserve a memory region of the cache memory by indicating to the cache controller that the reserved memory region is unavailable for allocation by the cache controller. In examples, the portions of the cache memory comprise cache lines or ways each storing data corresponding to a contiguous range of addresses in the higher level memory; and the control circuitry is configured to reserve one or more cache lines or ways.

In some examples, the apparatus comprises a plurality of memories, in which the control circuitry is configured to select a memory, of the plurality of memories, in which to reserve a memory region. The selection of a memory can depend upon the nature of the diagnostic data. For example, for the storage of diagnostic data dependent upon processing operations relating to subset of the plurality of memories, the control circuitry may be configured to select one or more memories of the plurality of memories other than the subset of the plurality of memories.

The plurality of memories may comprise a plurality of types of memories. In examples, the plurality of types of memories comprise two or more of:

a data cache;
a snoop filter memory;
a level 2 cache memory;
a level 3 cache memory;
an instruction cache;
a graphics data memory;
a data tightly coupled memory;
a buffer for branch prediction;
a buffer for branch targets;
a buffer for address translation; and
an instruction tightly coupled memory.

Although one instance of MBIST circuitry could be used in respect of all of the multiple memories, example arrangements comprise a plurality of MBIST circuitries, the diagnostic circuitry being connected to the plurality of MBIST circuitries by bus circuitry. In order that the MBIST circuitry is appropriately controlled to store the diagnostic data, in examples the control circuitry is configured to provide location information to the MBIST circuitry indicating one or more memory locations in the reserved memory region. To allow for a situation in which the diagnostic data exceeds (or may potentially exceed) the reserved memory capacity, a circular arrangement may be used in which the MBIST circuitry is configured to control writing of the diagnostic data to the reserved memory region according to an order of memory addresses, the order of memory addresses restarting in response to the reserved memory region being full of the diagnostic data.

When carrying out its memory testing functions, in examples the test procedure performed by the MBIST circuitry can be carried out in parallel with the functional operation of the data processing circuitry. This allows some of the memory within the data processing circuitry to be taken off-line for diagnostic data storage without affecting its functional operation but its performance may be reduced. Note however that this is not essential because (for example) a whole CPU could be taken off-line and the diagnostic data from another CPU or IP core (GPU, SCU, etc) could be stored in the memory of the off-line CPU.

Example arrangements include a debug apparatus connected to the external interface to receive the retrieved diagnostic data.

Another example embodiment provides a data processing apparatus comprising:

at least one memory means for storing data;
processing means to access data in the at least one memory means;
memory built-in self-test (MBIST) means having an interface means for accessing the at least one memory and being configured to perform a test procedure for testing at least one target memory location of the at least one memory, the test procedure comprising at least writing test data to the target memory location; and diagnostic means for executing a diagnostic procedure to generate diagnostic data in response to processing operations carried out by the processing means;
in which the MBIST means is configured to control writing of the diagnostic data generated by the diagnostic means to memory locations in the reserved memory region comprising at least a portion of the at least one memory means.

Another example embodiment provides a data processing method comprising:

providing memory built-in self-test (MBIST) circuitry having an interface to at least one memory to execute a test procedure for testing at least one target memory location of the at least one memory, the MBIST test procedure comprising at least writing test data to the target memory location;

temporarily reserving a memory region comprising at least a portion of the at least one memory;

executing a diagnostic procedure to generate diagnostic data in response to processing operations; and the MBIST circuitry controlling writing of the diagnostic data generated by the diagnostic means to memory locations in the reserved memory region.

Before discussing the drawings and example embodiments in detail, some further background information will be provided.

In examples of the present disclosure, diagnostic data storage reuses the normal functionality and on-line MBIST logic that may already be present in an IP core (a block of processing, which may be implemented as, or as part of, an integrated circuit device) but a small amount of additional functionality may also be used. Additional functionality may be provided in the MBIST controller. Typically, CPUs and other IP core types (such as a snoop control unit (SCU) or a level 3 cache memory (L3)) have functionality to disable all or part of a memory to save power or for other reasons and can still function normally in this mode.

Full on-line MBIST is not needed for diagnostic data storage because on-line MBIST is intended for short burst memory testing. In this use case the memory is tested transparently to SW running on the CPU and is automatically locked by the MBIST controller for a small number of clock cycles. The memory contents are not corrupted by this testing. This can be cheaply achieved because only a small number of RAM entries are accessed by each burst and so their contents can be saved and restored by the MBIST controller.

An example use of diagnostic data storage is to enable access to relatively large amounts of memory for a relatively long period of time. Hence, this would normally require that software takes the memory off-line and if necessary saves any dirty data to the next level of memory. This data flushing operation is done automatically by hardware in some IP cores (L3).

In the present techniques the MBIST controller does not necessarily reserve the memory or store its contents. It receives the diagnostic data from a bus (such as an advanced trace bus or ATB, for example ATBs 230a, 230b, 230c discussed below) and writes this data to the memory via an MBIST interface on an IP core. It also allows an external debugger to access the diagnostic data stored in memory via a debug peripheral bus (APB—already present for MBIST controller programming). Some features in the MBIST controller required for memory testing are reused, such as the address counter, which increments or decrements when a value is written to memory. The main additional MBIST controller features used in some examples of this technique are:

a diagnostic data bus interface (for example, ATB)
an ability to change memory array automatically during a session. This allows more than one RAM to be used to store data.

The memory contents are corrupted by the diagnostic data and so when the memory is brought back on-line it would typically need to be initialized and its contents restored. Circuitry for doing this is already present in IP cores for functional use at power-up or the like.

On-line MBIST also allows memories to be accessed in an off-line use model and only a subset of the functionality of on-line MBIST is used in this model. This model is also useful for memory testing because it allows production test algorithms to be used, which also take a relatively long time to run and corrupt the memory contents. In this model a CPUs pipeline is not stalled due to the MBIST accesses because the pipeline does not access a memory that is disabled by software. Accesses go to the next memory level instead. So, if an L1 d-cache is disabled (off-line), its accesses are passed to the L2 cache and the MBIST controller can access the L1 d-cache without effecting the operation of the CPU pipeline.

Cache ways or a whole cache can be can be taken off-line and used for diagnostic data storage. A practical implementation of the invention would use the data RAMs of a cache for storage because they are large memories and have a large data width, giving a high bandwidth. Data RAMs in some current caches are able to store 256-bits of data per write. This is useful to keep up with the data generated by an ELA, which can currently continuously produce 128-bits per clock cycle.

In some examples, the L2 and L3 caches would be useful candidate memories to use. L1 caches could also be used but they are smaller and may not have the ability to be taken off-line. Typically L2 and L3 caches can be taken off-line. There is also a trend for L2 caches to be local to a CPU and so it may be best to take the whole CPU off line to use its L2 cache to store the diagnostic data from another CPU. Some current L3 cache designs have a power saving feature that allow half of their ways to be powered down. These cache designs are also split into two independent halves, allowing different accesses to be carried out on both halves in parallel. This makes them ideal for use for diagnostic data storage.

Figure 1:
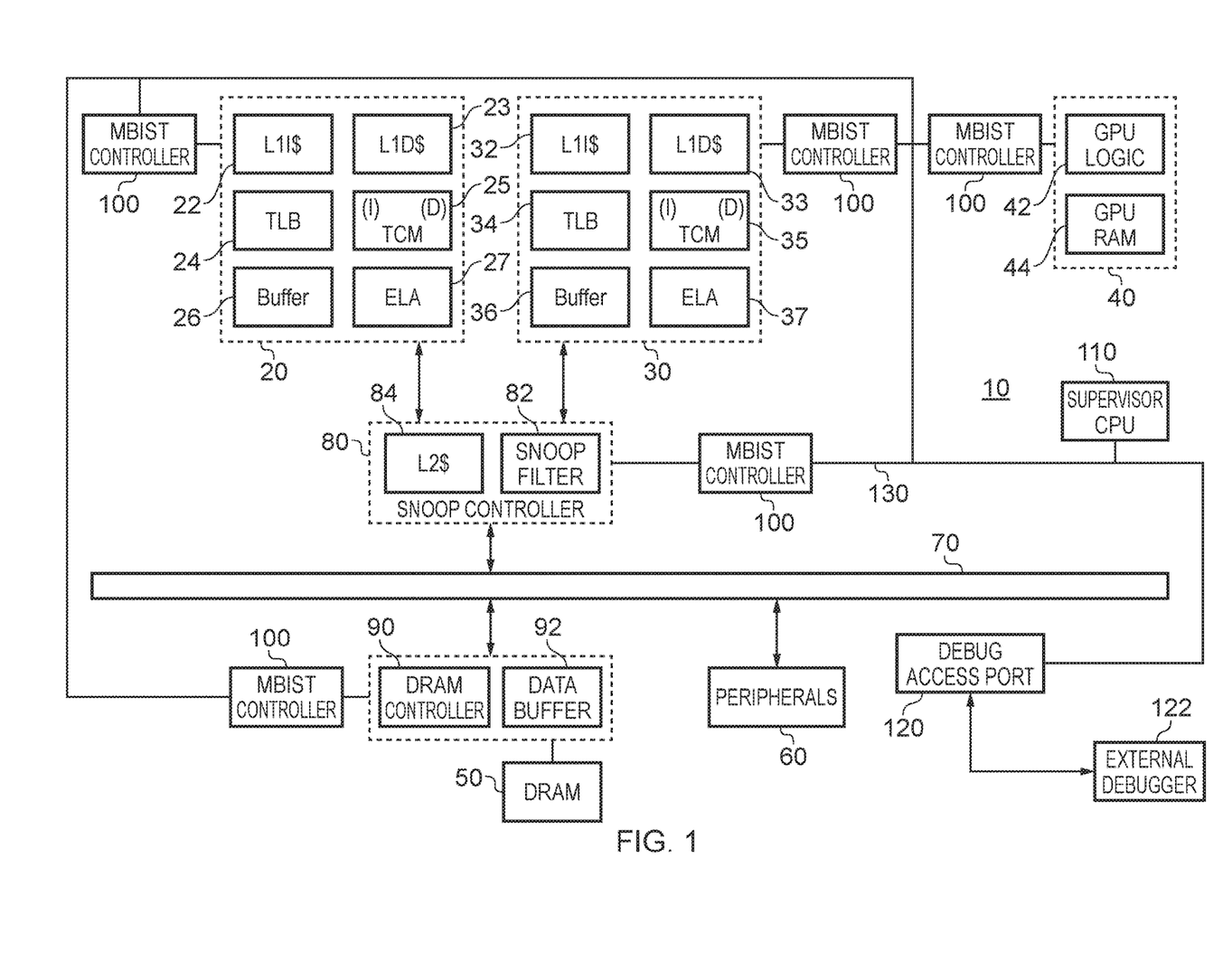
FIG. 1 schematically illustrates a data processing system.

FIG. 1 schematically illustrates a data processing system 10, such as a system-on-chip integrated circuit, including a first processor core 20, a second processor core 30, a graphics processing unit 40, a main memory 50 and one or more peripherals 60 all connected via an interconnect 70.

The first processor core 10 and the second processor core 20 each respectively contain: a level one instruction cache (L1I$) 22, 32; a level one data cache (L1D$) 23, 33; a translation lookaside buffer (TLB) 24, 34; an instruction tightly coupled memory (TCM) and a data TCM, drawn collectively as a TCM 25, 35; a buffer 26, 36 such as one or both of a buffer for branch prediction and a buffer for branch targets, and diagnostic circuitry 27, 37 such as an embedded logic analyser (ELA) or other diagnostic circuitry. Not all of these components need be associated with each processor core, but they are all shown in FIG. 1 for completeness.

In order to maintain coherency between the data caches 23, 33 within the first processor core 20 and the second processor core 30, a snoop control unit 80 serves to initiate snoop operations and coherency control utilizing, amongst other circuits, a snoop filter 82. The snoop control unit 80 also includes a level two cache (L2$) 84 which is shared by the first processor core 20 and the second processor core 30.

A DRAM controller 90 is disposed between the interconnect 70 and the main memory (DRAM) 50. The DRAM controller 90 has an associated data buffer 92 for buffering data accessed within the main memory 50, such as providing buffer storage for multiple lines of data most recently accessed within the main memory 50.

The graphics processing unit 40 includes GPU logic 42 and a random access memory (GPU RAM) 44 used for graphics processing operations performed by the graphics processing unit 40.

The memories 22, 23, 24, 25, 26, 32, 33, 34, 35, 36, 44, 50, 82, 84, 92 shown in FIG. 1 each have associated memory built-in self-test circuitry 100 which serves to perform memory built-in self-test operations upon their respective memories under control of a supervisor processor 110. Individual memory built-in self-test circuitry 100 may be dedicated to performing built-in self-test operations upon an individual memory (for example, in the case of the GPU RAM memory 44 within the graphics processing unit 40) or may be shared between multiple memories (for example in the case of the level one instruction cache 22, the level one data cache 23, the translation lookaside buffer 24, the tightly coupled memory 25 and the buffer memory 26 within the first processor 20).

As background in an on-line testing arrangement, when the supervisor processor 110 instructs one of the instances of the memory built-in self-test circuitry 100 to perform built-in self-test operation upon one of its respective associated memories, the memory built-in self-test circuitry 100 acts to reserve one or more entries within the memory to be tested. These entries are tested by the built-in self-test circuitry 100 using a short burst memory test algorithm that only takes a small number of clock cycles. The reserved memory entries are released by the built-in self-test circuitry 100 at the end of each burst. After each burst the built-in self-test circuitry 100 increments or decrements its address counter ready for the next memory entries to be tested. Each test burst is either triggered by a hardware pulse or by software. Hence, a memory is tested using a series of short burst and the gap between each burst is large compared to the length of each test burst. If the associated processing circuitry wishes to make use of those memory locations whilst they are reserved, then the processing circuitry is stalled until the built-in self-test operation has completed and the memory locations are released. By performing built-in self-test operations upon a small portion of a memory at a time, the length of each test burst can be kept short and so the likelihood of stalling operation of functional processing circuitry wishing to use that memory is kept low and so the intrusiveness of the built-in self-test operations may be reduced. Over an extended period of time the built-in self-test circuitry 100 will test all the entries within a memory. The built-in self-test circuitry 100 informs the supervisor processor 110 when it has completed testing a memory and if a test has passed or failed. The supervisor processor 110 will then instruct the built-in self-test circuitry 100 to test the next memory. Hence, in the on-line testing model, all the memories associated with the built-in self-test circuitry 100 can be continually tested during functional operation of the associated data processing circuitry 10. In an off-line testing model, memory portions are taken off-line (temporarily withdrawn from use) for testing, and are then returned to use after testing.

The diagnostic circuitry 27, 37 is provided to carry out diagnostic operations with respect to the processor cores. Other diagnostic circuitries (not shown on FIG. 1) may also be provided in respect of tracing other operations. Diagnostic circuitry can be provided for other units or IP cores, not merely for processor cores. An example of such diagnostic circuitry is a so-called embedded logic analyser. This can detect the state of signals within the processor core and generates diagnostic data indicative of those detections. Signal "traces" or detections by such circuitry can provide visibility for diagnostic purposes of interface or transaction sequences and so can be of use in diagnosing bugs, and in particular isolating bugs to a particular processor core or region of a processor core. Another example of diagnostic circuity is an embedded trace macro (ETM). This allows execution of SW running on a CPU to be traced in a non-invasive way. In an ETM, trace data can be stored in a dedicated SRAM and accessed by an external debugger or is sent to an external trace interface and stored in an external trace capture unit. Signal traces in processor cores or other circuitry (such as interconnects or network interfaces) that run at high frequencies can generate a large quantity of high frequency diagnostic data. In example embodiments, instead of providing a dedicated memory (such as an SRAM) to store such diagnostic data, the existing memories within FIG. 1 are selectively used to store the diagnostic data under the control of the MBIST controllers.

The diagnostic circuitries operate under the control of an external debugger 122 (shown in FIG. 1 but—at least in some examples—considered as external to the apparatus of FIG. 1—connectable to the apparatus of FIG. 1 by a debug access port 120. The debug access port, diagnostic circuities, MBIST controllers and supervisor CPU are connected by a bus 130.

The apparatus of FIG. 1 therefore provides an example of a data processing apparatus 10 comprising: at least one memory (22, 23, 24, 25, 26, 32, 33, 34, 35, 36, 44, 50, 82, 84 and/or 92) configured to store data; processing circuitry (20, 30, 42, 82, 90) to access data in the at least one memory; memory built-in self-test (MBIST) circuitry 100 having an interface to access the at least one memory and being configured to perform a test procedure for testing at least one target memory location of the at least one memory, the test procedure comprising at least writing test data to the target memory location; and diagnostic circuitry (27, 37) to execute a diagnostic procedure to generate diagnostic data in response to processing operations carried out by the processing circuitry. FIG. 1 provides an example in which two or more memories are provided, and an example in which a plurality of types of memories are provided. In the example of FIG. 1, the plurality of types of memories comprise two or more of: a data cache; an instruction cache; a graphics data memory; a data tightly coupled memory; a buffer for branch prediction; a buffer for branch targets; a buffer for address translation; an instruction tightly coupled memory; a snoop filter memory; a level 2 cache memory; and a level 3 cache memory.

Figure 2:
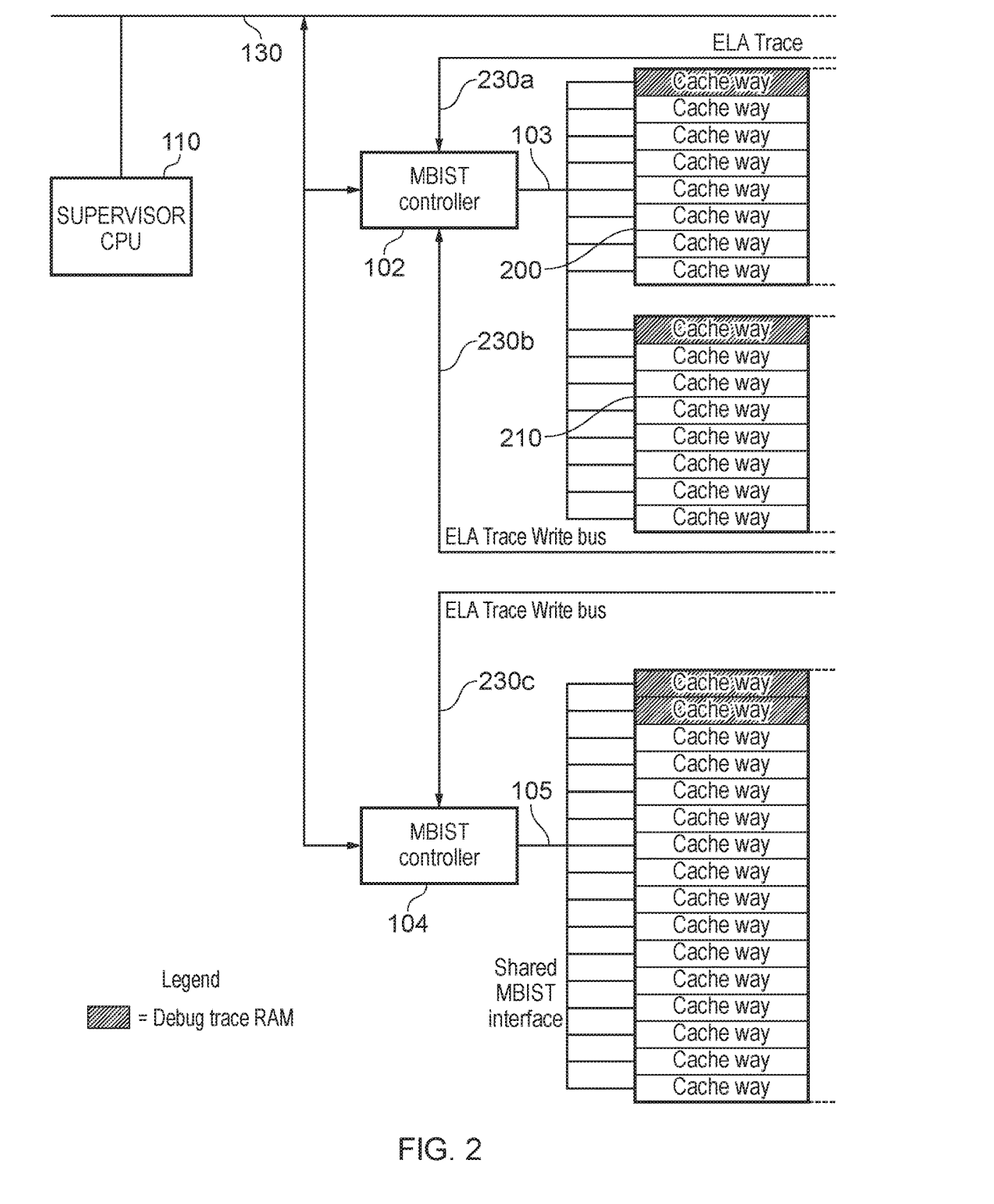
FIG. 2 schematically illustrates parts of the data processing system of FIG. 1 in more detail.

FIG. 2 schematically illustrates parts of the data processing system of FIG. 1 in more detail. In FIG. 2, the two processor cores (CPUs) of FIG. 1 are shown, along with their respective ELA devices 27, 37. As another example, however, an MBIST controller 102 is shared between the two processor cores. In general, each processor core could have its own MBIST controller, or more than one MBIST controller, or multiple processor cores could share a smaller number of MBIST controllers. The examples of FIGS. 1 and 2 includes a plurality of MBIST circuitries, the diagnostic circuitry being connected to the plurality of MBIST circuitries by bus circuitry 130.

Each processor core has associated cache memory 200, 210 which is illustrative of any of the memory in FIG. 1 associated with that processor core, such as the level one instruction cache, the level one data cache, the TLB, the TCM or the buffer. The discussion below will assume that the memory 200, 210 is one of the cache memories but it could be any of the memories discussed above.

The ELA circuitry 27, 37, when enabled for operation, detects signals associated with processing operations carried out by the respective processor core via debug signal buses 220. The processing operations may be instruction execution operations or other operations such as bus access or data transfer operations. The ELA circuitry generates so-called trace data indicative of the nature of those processing operations (for example, indicating bus transitions or other aspects of execution of an instruction) and provides the trace data on ELA trace write buses 230a,b,c.

In previously proposed arrangements, a dedicated on-chip memory such as an SRAM could have been provided to store the trace data. However, in the present examples, at least a part of one or more of the existing system memories is used, under the control of an MBIST controller, to store the trace data.

As discussed above, an MBIST controller is arranged to take control of (or reserve) a portion of memory and write test values to it, then to read the test values from the memory under test. In the present arrangements, the same data write and data read mechanisms are used but instead of writing test data to a portion of memory, the ELA trace data is written and is then retrieved for (for example) external analysis by the external debugger 122. In this regard, the external debugger provides an example of all or a part of a debug apparatus connected to the external interface to receive the retrieved diagnostic data.

To achieve this, memory is taken off-line (for example, by software running on a CPU or the external debugger 122) for temporary storage of diagnostic data. It then writes the diagnostic data to that portion of the memory via an MBIST interface 103, 105. Subsequently, the MBIST controller can read the data from the reserved portion of memory via the MBIST interface 103, 105 and provide it to the (or an) external debugger 122 via the debug access port 120. The reserved portion of memory can then be released.

The example of FIG. 2 includes three ELA circuitries, including one ELA circuitry 240 associated with a cache controller (shown schematically as a level n (Ln) cache controller indicating that the technique is applicable to any memory level). Data from the ELA circuitries, when they are enabled for diagnostic operation, can be stored under the control of the MBIST controllers in any of the memories shown in FIG. 2, or indeed any amongst the wider selection of memories shown in FIG. 1. Example portions of those memories which are temporarily reserved for storing diagnostic data in this way are shown in FIG. 2 as shaded portions. In examples, and as will be discussed further below, diagnostic data relating to the operation of a particular device within the data processing apparatus (for example, diagnostic data relating to operation of a particular CPU or cache controller) may be stored in a memory normally associated with a different part of the operation of the apparatus of FIG. 1. This is because it can be useful to store diagnostic data relating to a potentially buggy portion of the apparatus in another portion of the apparatus, to avoid the storage of the diagnostic data being itself (potentially) affected by the suspected bug. This method allows systematic hardware and software bugs introduced at the design stage to be diagnosed in a physical integrated circuit.

In FIG. 2, the debug access port 120 can communicate with the ELA circuitries, for example to provide control data to establish a testing protocol or arrangement, and can also communicate with the MBIST controllers and the supervisor CPU, by a so-called advanced peripheral bus (APB) interconnection 250.

Figure 3:
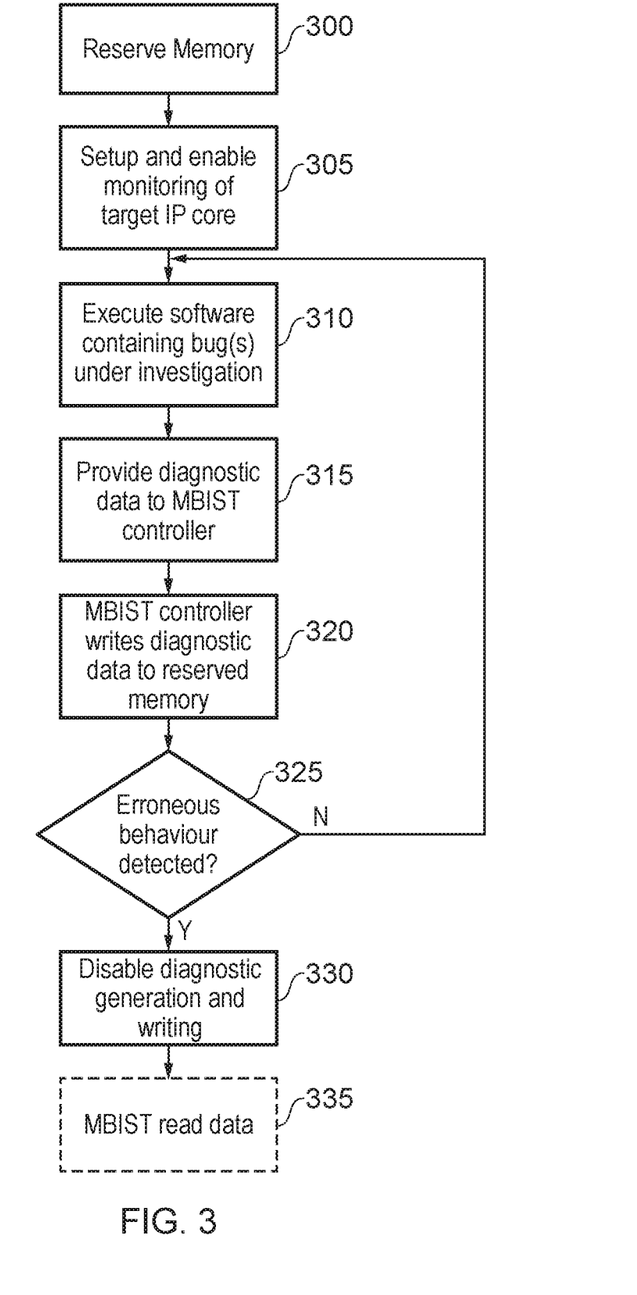
FIG. 3 is a schematic flowchart illustrating a method.

FIG. 3 is a schematic flow chart illustrating a method having, as a context, the arrangement of FIGS. 1 and 2 by which there is provided memory built-in self-test (MBIST) circuitry which is re-purposed for the storage of diagnostic data in functional memory. At a step 300, at least a portion of at least one memory within the apparatus of FIG. 1 is reserved for the storage of diagnostic data and taken off-line. The reservation process will be discussed in more detail below.

The apparatus provides control circuitry to reserve a memory region comprising at least a portion of the at least one memory, to store the diagnostic data generated by the diagnostic circuitry executing the diagnostic procedure. The control circuitry can comprise the external debugger 122 which can act directly to disable a memory or a part of a memory. However, in other examples, the control circuitry optionally includes one or more of the processor cores 20, 30, such that the external debugger can indirectly cause the reservation of the memory or part memory by communicating with software running on that processor core. In either case, it may be appropriate for the external debugger to inform a processor core that it has disabled a memory or part memory which that processor core interacts with, at least for the reason that the processor core does not then attempt to re-enable that memory or part of a memory.

Note that portions of two or more memories may be reserved and may be treated, by the MBIST controller (or by more than one MBIST controller), as a single composite buffer for the storage of diagnostic data by the present techniques.

In examples, the control circuitry can be configured to provide location information to the MBIST circuitry indicating one or more memory locations in the reserved memory region.

Note that the reserved region could encompass the whole of a memory or part of it, and could span two or more memories (that is to say, a part or all of one memory and a part or all of another memory, whether or not the memories are accessed in normal use by the same processor core or other device, and whether or not the address spaces of the two memories are contiguous).

The external debugger controls the ELAs and MBIST controllers, configuring and enabling them as required by the user. Part of this operation can include setting up and enabling the other apparatus feature of FIG. 1 at a step 305.

At a step 310, software is executed by the appropriate processor core which contains the bug(s) under investigation. At a first instance of the step 310, the execution of such software is initiated. At subsequent instances of the step (as shown schematically by the return arrow from the step 325 discussed below) the execution is continued. Note however that in a practical system the step 310 may well run in parallel with steps 315, 320, 325 to be discussed below.

At a step 315 the diagnostic circuitry such as one or more of the ELA circuitries executes a diagnostic process and generates diagnostic data from the information received from the processor cores or other apparatus features they are monitoring, which is supplied to the MBIST controller.

At a step 320, the diagnostic data is written to the reserved memory portion by the appropriate one of the MBIST controllers.

Note that as mentioned above the steps 310 . . . 325 may occur repeatedly and substantially simultaneously (for example, in parallel), such that as each item of diagnostic data is generated and passed to the MBIST controller, it can be written to the reserved memory. This step 320 provides an example in which the MBIST circuitry is configured to control writing of the diagnostic data generated by the diagnostic circuitry to memory locations in the reserved memory region.

The MBIST circuitry may optionally be configured to control writing of the diagnostic data to the reserved memory region in a circular fashion, which is to say according to an order of memory addresses, the order of memory addresses restarting in response to the reserved memory region being full of the diagnostic data. In this way, the operations 310, 315, 320 325 can continue until erroneous behaviour is detected at the step 325 or the diagnostic process is stopped (for example, under the control of the external debugger 122) for any other reason.

In response to a "yes" detection at the step 325, the diagnostic operation and the writing of diagnostic data is stopped at a step 330, for example being disabled, suspended or otherwise terminated.

Subsequently and optionally, at a step 335, the contents of the reserve memory can be read by an external debugger 122 via the MBIST controller (using the debug access port (DAP)) for analysis. This provides an example of the MBIST circuitry being configured to execute a memory read procedure to retrieve data stored in the reserved memory region and to provide the retrieved data to an external interface.

Figure 4:
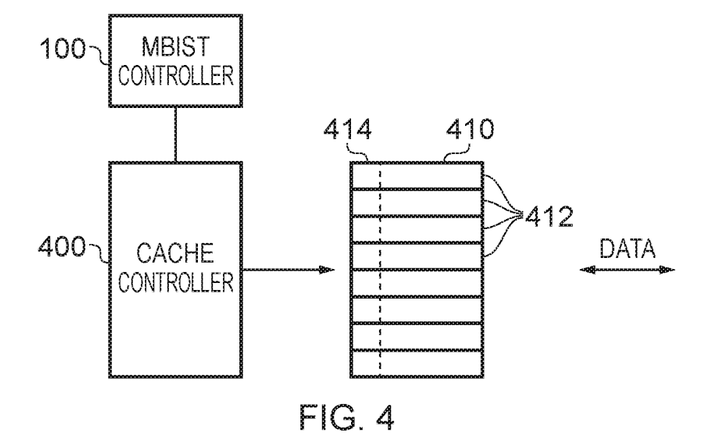
FIG. 4 schematically illustrates a cache controller.

FIG. 4 schematically illustrates a cache controller.

A cache controller (such as the cache controller 400 of FIG. 4) oversees the storage and retrieval of data to and from a cache memory such as a memory 410 of FIG. 4. This is therefore an example of the at least one memory comprising a cache memory; and the apparatus comprising a cache controller to control the storage of data to, and the retrieval of data from, the cache memory.

Various modes of operation of a cache memory have been proposed, but a generally common feature is that a cache memory is smaller than the main or higher level memory which it supports, but, at least in some circumstances, can be faster than the main or higher level memory. Because the cache memory is smaller than the main or higher level memory which it supports, the cache controller 400 oversees which data are stored in the cache memory out of the wider selection of data held by the main or higher level memory.

In examples, the cache memory 410 is arranged as multiple regions or "lines" 412, each line storing one or more data items (typically, a group of data items such as eight 4-byte words), with each line having associated data 414 such as so-called tag data indicating an address in the main or higher level memory to which the corresponding line relates. The cache controller 400 controls the allocation of cache lines or ways 412 to address regions within the main or higher level memory in an attempt to provide, in the cache memory 410, data which are most likely to be required next by a device using the cache memory. Therefore in examples, the cache controller is configured to allocate portions of the cache memory for temporary storage of data corresponding to addresses in a higher level memory. The portions of the cache memory can comprise cache lines or ways each storing data corresponding to a contiguous range of addresses in the higher level memory.

Figure 5:
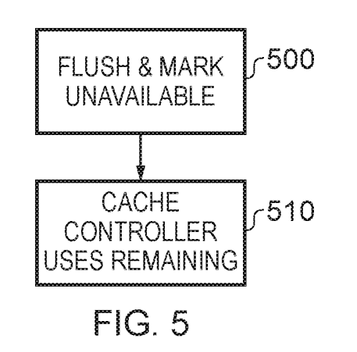
FIG. 5 is a schematic flowchart illustrating memory reservation.

With reference to FIG. 5, in order to reserve a portion of the cache memory 410 for temporary use in storing diagnostic data, the control circuitry (examples of which are discussed above, and which may include the external debugger, possibly operating in cooperation with software running on a processor core) communicates with the cache controller 400 so as to cause the cache controller 400 to flush (which is to say, write back to the main or higher level memory) one or more of the lines of the cache memory 410, and to mark those lines as unavailable, but without removing power or clock signals from those lines. This provides an example in which the control circuitry is configured to reserve a memory region of the cache memory by indicating to the cache controller that the reserved memory region is unavailable for allocation by the cache controller. This is carried out at a step 500 of FIG. 5. The cache controller 400 carries on operations based upon a temporarily smaller cache memory 410, which is to say that the cache controller continues to use the remaining cache lines or ways at a step 510, being those which are not marked as unavailable. This provides an example in which the at least one memory is configured to continue allowing access by the processing circuitry to memory locations other than memory locations in the reserved memory region.

Figure 6:
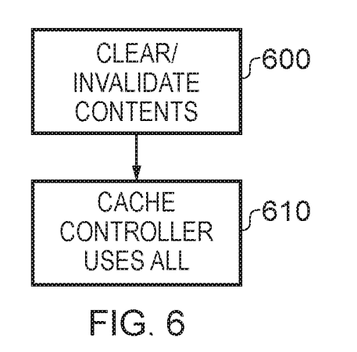
FIG. 6 is a schematic flowchart illustrating memory release.
Figure 7:
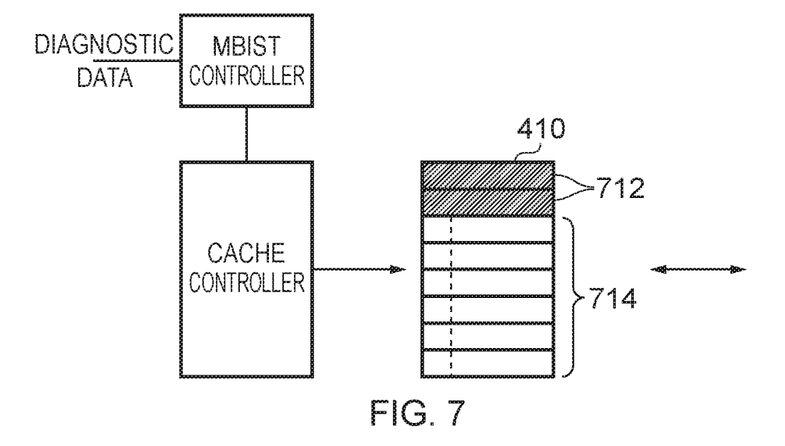
FIG. 7 schematically illustrates a reserved memory portion.

Referring to FIG. 7 a set of temporarily "marked as unavailable" cache lines 712 is indicated by a shaded portion of the cache memory 410. This is an example of the control circuitry being configured to reserve one or more cache lines or ways. The cache controller operates with respect to a remaining portion 714 of the cache memory 410, but the MBIST controller uses the cache lines or ways 712 to store diagnostic data received from one of the ELA circuitries. Subsequently, as discussed above, the MBIST controller can read the diagnostic data from the cache lines or ways 712. At this point, a process to release the cache line or way 712 is carried out as indicated by the flow chart of FIG. 6 in which, at a step 600, the cache memory (operating under the direct or indirect control of the external debugger) clears or invalidates the contents of the reserved cache lines or ways 712. At a step 610, the cache controller uses all of the cache memory 410 rather than just the portion 714. The flowchart of FIG. 6 provides an example of the control circuitry being configured to release the reserved memory region following completion of the memory read procedure in respect of the reserved memory region.

Figure 8:
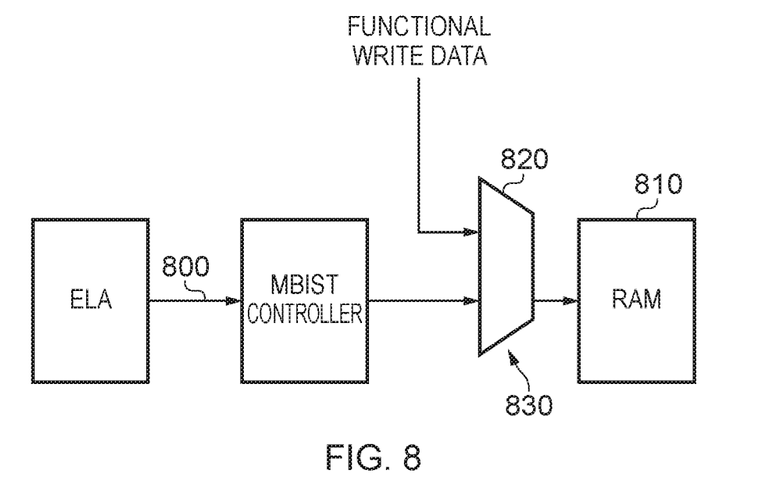
FIGS. 8 and 9 schematically illustrate data writing and reading (respectively) via an MBIST controller.
Figure 9:
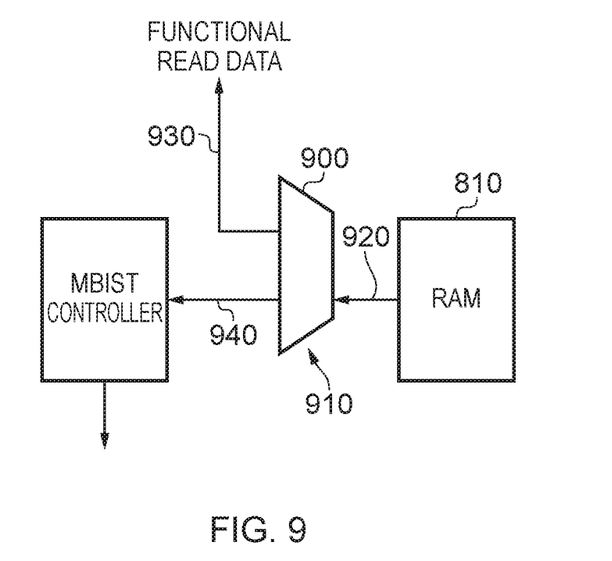

FIGS. 8 and 9 schematically illustrate data writing and reading respectively via an MBIST controller according to the present examples.

In FIG. 8, a data writing process is schematically represented, in which diagnostic data 800 generated by one of the ELA circuitries is provided to an MBIST controller for storage in a temporarily reserved portion of one of the memories 810. Rather than writing the data via a processor core or other controller, the MBIST controller writes data directly to the memory 810 via a multiplexer 820 which, under the control of a control signal 830 (for example, generated by the MBIST controller in question) passes either data from the MBIST controller or "conventional" write data from the processor core or other device.

FIG. 9 schematically illustrates a data read process in which once again a demultiplexer 900 operates under the control of a control signal 910 generated, for example, by the MBIST controller to provide read data 920 from the memory 810 either to the processor core or other device as conventional read data 930 or to the MBIST controller as data 940 for output to external apparatus.

Figure 10:
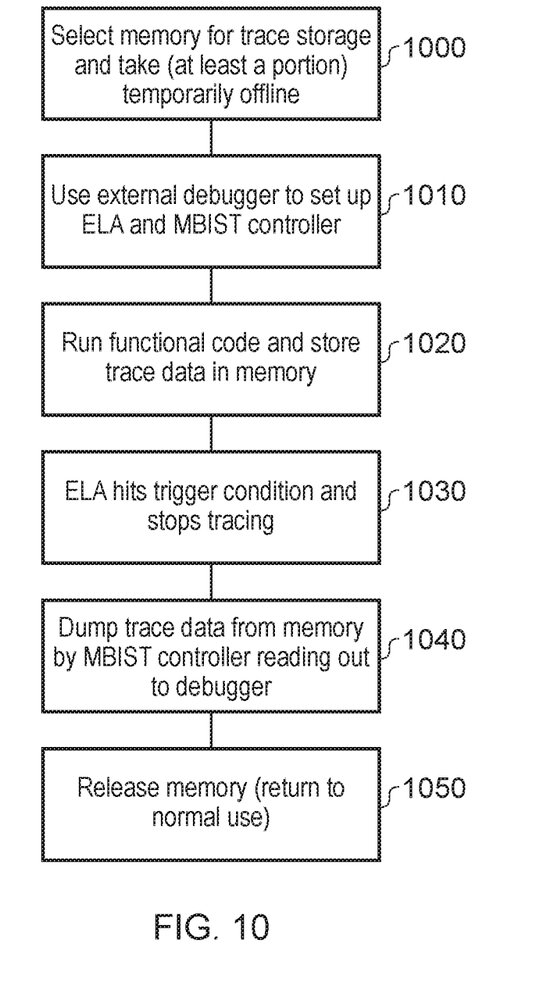
FIGS. 10 and 11 are schematic flowcharts illustrating respective methods.

FIG. 10 is a schematic flow chart illustrating a method.

The process for generating, storing and retrieving diagnostic data starts at a step 1000, at which a memory is selected for trace storage and, as discussed above, at least a portion of that memory is taken temporarily offline for the storage of trace data. This provides an example in which the control circuitry is configured to select a memory, of the plurality of memories, in which to reserve a memory region. As discussed, a memory which is at least partly independent of the functional operation of the data processing apparatus or a suspected bug can be selected, in which case, for the storage of diagnostic data dependent upon processing operations relating to subset of the plurality of memories, the control circuitry is configured to select one or more memories of the plurality of memories other than the subset of the plurality of memories. So, for example, trace data relating to operations of one processor core could be stored in a memory or memories relating to another processor core.

At a step 1010, the external debugger 122 sets up the ELA and MBIST controller. The setting up of the ELA can involve (for example) instructing the ELA to monitor particular aspects of processing, for example particular data, address or other signals, and establishing a trigger condition which—when detected—will cause the ELA to cease tracing activity. For example the trigger condition might be a condition indicative of a bug.

At a step 1020 the system runs functional code, so that monitoring for the bug can be carried out during the running of that code. This could involve initiating an operating system (such as the Linux™ operating system) and running code under that operating system. Or the operating system could already have been initiated by the time that the step 1020 is reached. The step 1020 also comprises the storage by the MBIST controller of trace data generated by the ELA in the memory or memory portion established at the step 1000.

At a step 1030, the ELA detects the trigger condition and stops tracing activity. It stops generating trace data and—in response—the MBIST controller stops writing the trace data to the memory or memory portion (though any final trace data provided by the ELA is stored).

At a step 1040, the stored trace data is read out or "dumped" from the memory or memory portion to the external debugger by the MBIST controller.

Finally, at a step 1050, when the dump is complete, the external debugger releases the memory which returns to a normal operational mode.

Various features of the embodiments discussed above are as follows.

Using an existing functional memory circuit rather than a dedicated memory such as an SRAM can provide a more efficient use of space in an integrated circuit embodiment. A detected memory can take up space which is not always required so the temporary of a use of a portion of an existing memory avoids the need for the dedicated memory. Leakage problems which may otherwise be associated with a dedicated memory can be alleviated.

Typically, a dedicated memory for diagnostic data might be quite small (an example being a one kilobyte memory supporting 64 trace entries of 128 signal bits. By contrast, a 2 megabyte level 2 cache could store 16384 trace entries of 128 signal bits in two disabled ways. Even a 512 kilobyte level 2 cache would support 4096 trace entries of 128 debug signal bits. Note that the ability to take a memory or part of a memory off-line, and for the processor or other device to continue to operate without it, is itself known.

The examples provide an elegantly straightforward implementation in terms of changes to the MBIST circuitry. The MBIST controller only needs a write data value and valid signal from the ELA. The MBIST controller can generate the address to write the data into the disabled memory region. It can also wrap the address to create a circular buffer or stop when the buffer is full. There is no need for dedicated ELA memory read/write control associated with a dedicated SRAM.

The ELA and MBIST controller can be programmed by an external debugger. In examples, when instructed by the debug controller, the target memory would then be selected by the MBIST controller and remain selected throughout the trace session. In examples, more than one memory could be used to store the trace or diagnostic data (in that case those values may change during tracing).

The other memories that are not being used for storing trace data could be enabled for normal functional use. They would be accessed as not and would not be affected by the trace accesses to the functionally disabled memories.

When tracing is complete, the trace data can then be read by a debugger from the disabled memory via the MBIST controller. This removes the need for read path logic associated with the ELA circuitry.

Figure 11:
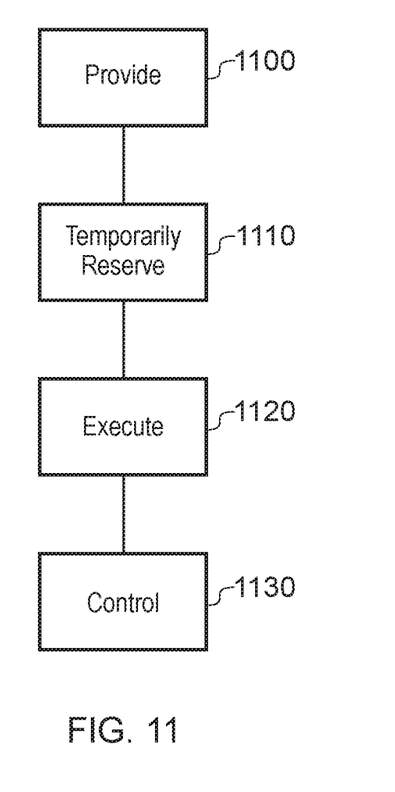

FIG. 11 is a schematic flowchart illustrating a data processing method comprising:

providing (at a step 1100) memory built-in self-test (MBIST) circuitry having an interface to at least one memory to execute a test procedure for testing at least one target memory location of the at least one memory, the MBIST test procedure comprising at least writing test data to the target memory location;

temporarily reserving (at a step 1110) a memory region comprising at least a portion of the at least one memory;

executing (at a step 1120) a diagnostic procedure to generate diagnostic data in response to processing operations; and the MBIST circuitry controlling writing (at a step 1130) of the diagnostic data generated by the diagnostic means to memory locations in the reserved memory region.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device (such as a processing element as discussed above) may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

We claim:
1. A data processing apparatus comprising:
at least one memory configured to store data, the at least one memory comprising a cache memory;
processing circuitry to access data in the at least one memory;
memory built-in self-test (MBIST) circuitry having an interface to access the at least one memory and being configured to perform a test procedure for testing at least one target memory location of the at least one memory, the test procedure comprising at least writing test data to the target memory location;

diagnostic circuitry to execute a diagnostic procedure to generate diagnostic data in response to processing operations carried out by the processing circuitry;

a cache controller to control data storage to, and data retrieval from, the cache memory; and control circuitry to reserve a memory region comprising at least a portion of the at least one memory, to store the diagnostic data generated by the diagnostic circuitry executing the diagnostic procedure;

wherein:

the MBIST circuitry is configured to control writing of the diagnostic data generated by the diagnostic circuitry to memory locations in a temporarily reserved memory region comprising at least a portion of the at least one memory;

the cache controller is configured to allocate portions of the cache memory for temporary storage of data corresponding to addresses in a higher level memory; and the control circuitry is configured to reserve a memory region of the cache memory by indicating to the cache controller that the temporarily reserved memory region is unavailable for allocation by the cache controller.

2. Apparatus according to claim 1, in which the MBIST circuitry is configured to execute a memory read procedure to retrieve data stored in the temporarily reserved memory region and to provide the retrieved data to an external interface.

3. Apparatus according to claim 2, in which the at least one memory is configured to continue allowing access by the processing circuitry to memory locations other than memory locations in the temporarily reserved memory region.

4. Apparatus according to claim 2 in which the control circuitry is configured to release the temporarily reserved memory region following completion of the memory read procedure in respect of the temporarily reserved memory region.

5. Apparatus according to claim 1, in which:

the portions of the cache memory comprise cache lines or ways each storing data corresponding to a contiguous range of addresses in the higher level memory; and the control circuitry is configured to reserve one or more cache lines or ways.

6. Apparatus according to claim 1, comprising a plurality of memories, in which the control circuitry is configured to select a memory, of the plurality of memories, in which to reserve a memory region.

7. Apparatus according to claim 6, in which, for the storage of diagnostic data dependent upon processing operations by the processing circuitry relating to a subset of the plurality of memories, the control circuitry is configured to select one or more memories of the plurality of memories other than the subset of the plurality of memories.

8. Apparatus according to claim 7, comprising a plurality of types of memories.

9. Apparatus according to claim 8, wherein the plurality of types of memories comprise two or more of:

a data cache;
a snoop filter memory;
a level 2 cache memory;
a level 3 cache memory;
an instruction cache;
a graphics data memory;
a data tightly coupled memory;
a buffer for branch prediction;
a buffer for branch targets;
a buffer for address translation; and
an instruction tightly coupled memory.

10. Apparatus according to claim 6, comprising a plurality of MBIST circuitries, the diagnostic circuitry being connected to the plurality of MBIST circuitries by bus circuitry.

11. Apparatus according to claim 1, in which the control circuitry is configured to provide location information to the MBIST circuitry indicating one or more memory locations in the temporarily reserved memory region.

12. Apparatus according to claim 1, in which the MBIST circuitry is configured to control writing of the diagnostic data to the temporarily reserved memory region according to an order of memory addresses, the order of memory addresses restarting in response to the temporarily reserved memory region being full of the diagnostic data.

13. Apparatus according to claim 2, comprising a debug apparatus connected to the external interface to receive the retrieved data.

14. A data processing apparatus comprising:

at least one memory means for storing data;

processing means to access data in the at least one memory means, the at least one memory means comprising a cache memory means;

memory built-in self-test (MBIST) means having an interface means for accessing the at least one memory and being configured to perform a test procedure for testing at least one target memory location of the at least one memory, the test procedure comprising at least writing test data to the target memory location; and diagnostic means for executing a diagnostic procedure to generate diagnostic data in response to processing operations carried out by the processing means;

cache controller means for controlling the storage of data to, and the retrieval of data from, the cache memory means; and control means for reserving a memory region comprising at least a portion of the at least one memory means, to store the diagnostic data generated by the diagnostic circuitry executing the diagnostic procedure;

wherein:

the MBIST means is configured to control writing of the diagnostic data generated by the diagnostic means to memory locations in a temporarily reserved memory region comprising at least a portion of the at least one memory means;

the cache controller means is operable to allocate portions of the cache memory means for temporary storage of data corresponding to addresses in a higher level memory; and the control means is operable to reserve a memory region of the cache memory means by indicating to the cache controller means that the temporarily reserved memory region is unavailable for allocation by the cache controller means.

15. A data processing method comprising:

providing memory built-in self-test (MBIST) circuitry having an interface to a cache memory to execute a test procedure for testing at least one target memory location of the cache memory, the MBIST test procedure comprising at least writing test data to the target memory location;

controlling, using a cache controller, the storage of data to, and the retrieval of data from, the cache memory;

the cache controller allocating portions of the cache memory for temporary storage of data corresponding to addresses in a higher level memory;

temporarily reserving a memory region comprising at least a portion of the at least one memory;

executing a diagnostic procedure to generate diagnostic data in response to processing operations; and the MBIST circuitry controlling writing of the diagnostic data generated by the executing step to memory locations in a memory region reserved by the temporarily reserving step;

the reserving step comprising indicating to the cache controller that the memory region reserved by the temporarily reserving step is unavailable for allocation by the cache controller.

\* \* \* \* \*